United States Patent [19]

Duvvury et al.

[11] Patent Number: 4,608,670
[45] Date of Patent: Aug. 26, 1986

[54] CMOS SENSE AMPLIFIER WITH N-CHANNEL SENSING

[75] Inventors: Charvaka Duvvury, Missouri City; Adin E. Hyslop, Houston, both of Tex.

[73] Assignee: Texas Instruments Incorporated, Dallas, Tex.

[21] Appl. No.: 636,939

[22] Filed: Aug. 2, 1984

[51] Int. Cl.$^4$ .............................................. G11C 7/00
[52] U.S. Cl. ................................... 365/205; 365/203
[58] Field of Search ................ 365/205, 210, 203, 222

[56] References Cited
U.S. PATENT DOCUMENTS 4,195,357  3/1980  Kuo et al. .......................... 365/210

OTHER PUBLICATIONS
IBM Technical Disclosure Bulletin-vol. 25, No. 10, Mar. 1983, pp. 5088-5091.

Primary Examiner—James W. Moffitt
Attorney, Agent, or Firm—John G. Graham

[57] ABSTRACT

A CMOS sense amplifier for a dynamic read/write memory employs a latch circuit with cross-coupled N-channel transistors and cross-coupled P-channel transistors, returned to the voltage supply and ground through P and N channel transistors selectively activated by sense clocks. Differential inputs of the sense amplifier are connected to the bit lines. The N-channel transistors are employed for initial sensing, and then both N-channel and P-channel transistors in sequential order for amplification and restoring the 1-level. This results in better balance, and smaller N and P channel latch transistors may be used, saving area, saving power and increasing speed.

15 Claims, 8 Drawing Figures

4,608,670

CMOS SENSE AMPLIFIER WITH N-CHANNEL SENSING

RELATED CASES

This application discloses subject matter also disclosed in copending applications Ser. No. 636,938, and Ser. No. 635,940 filed Aug. 2, 1984, all assigned to Texas Instruments.

BACKGROUND OF THE INVENTION

This invention relates to semiconductor devices, and more particularly to sense amplifier circuits for dynamic read/write memory devices.

Dynamic MOS read/write memory devices have been constructed using bistable latches as differential sense amplifiers generaly as shown in U.S. Pat. No. 4,081,701 (a 16K dynamic RAM) issued to White, McAdams and Redwine, or U.S. Pat. No. 4,239,993 (a 64K dynamic RAM) issued to McAlexander, White and Rao, both assigned to Texas Instruments. These prior devices employed all N-channel transistors in the latches of the sense amplifiers. When memory devices of this type are manufactured in higher densities, such as 256K and 1-Megabit and beyond, the need for lower current per sense amplifier necessitates use of CMOS latches, and the problem of fast and reliable sensing, with circuits which may be manufactured at reasonable yields, becomes formidible.

In a dynamic RAM the sensing operation is critically dependent upon the latch transistors. These transistors must be balanced in threshold voltage Vt, and in KP, to within 10% for reliable operation. The prior sense amplifiers using only N-channel transistors required active pull-up circuits to produce a full rail-to-rail separation of the bit lines. CMOS latches provide rail-to-rail separation without such pull-up circuitry. However, the latch is less reliable when P-channel transistors are used in the initial sensing.

In a 1-Megabit DRAM that is refreshed at 512 per period, there are 2048 sense amplifiers which flip at the same time during an active cycle. Each one of these requires current to charge a bit line to Vdd, or discharge a bit line to Vss, or both, depending upon the precharge level. The voltage supply to the chip thus sees a large current spike in a short time period; as the access time is increased, the magnitude of the current spike increases. Thus, careful sizing of the latch and return transistors to minimize unnecessary current drain is advantageous.

It is the principal object of this invention to provide an improved sense amplifier circuit for high density dynamic RAM devices, particularly for high-speed, low power devices which may be economically manufactured. Another object is to provide a sense amplifier circuit for a CMOS dynamic RAM in which the size is minimized and reliability is improved. A further object is to provide high speed, low current circuitry for semiconductor devices which contain bistable or latch circuits and the like.

SUMMARY OF THE INVENTION

In accordance with one embodiment of the invention, a CMOS sense amplifier for a dynamic read/write memory empolys a latch circuit with cross-coupled N-channel transistors and cross-coupled P-channel transistors, returned to the voltage supply and ground through P and N channel transistors selectively activated by sense clocks. Differential inputs of the sense amplifier are connected to the bit lines. The N-channel transistors are employed for initial sensing, and then both N-channel and P-channel transistors in sequential order for amplification and restoring the 1-level. This results in better balance, and smaller N and P channel latch transistors may be used, saving area, saving power and increasing speed.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE SPECIFIC EMBODIMENT

Figure 1:
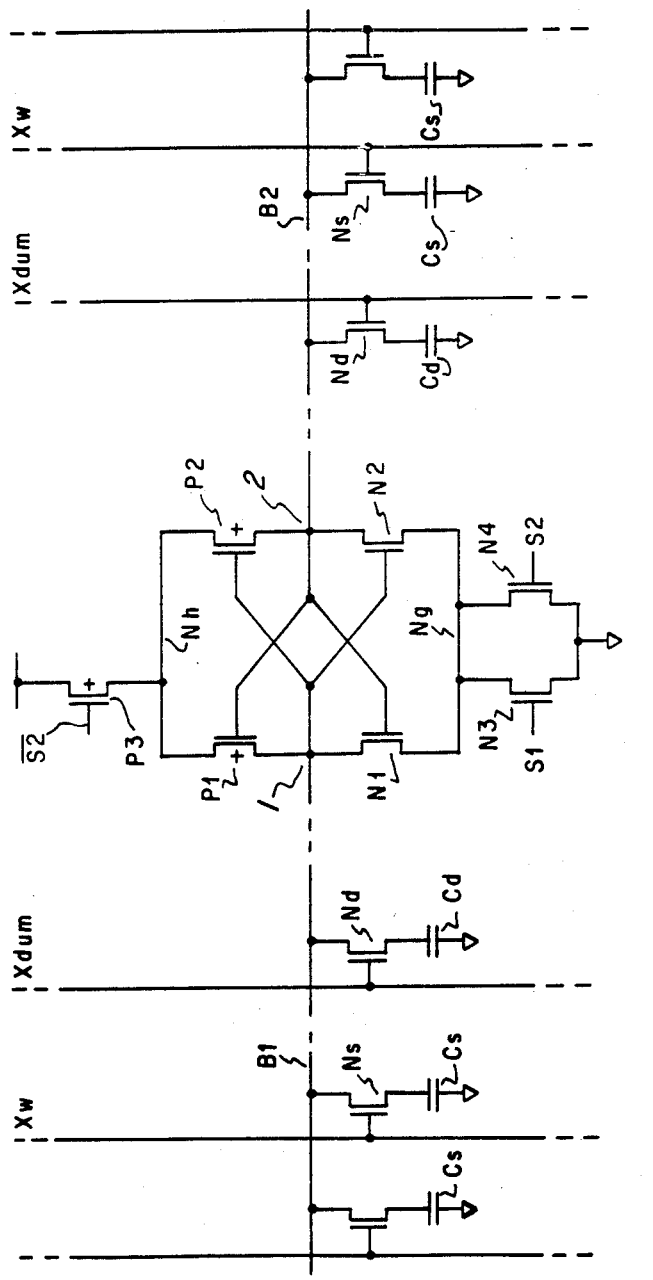
FIG. 1 is an electrical schematic diagram of a sense amplifier circuit according to the invention.

Referring to FIG. 1, a sense amplifier circuit for a dynamic RAM array is illustrated according to the invention. The sense amplifier employs a CMOS cross-coupled flip-flop circuit having a pair of N-channel driver transistors N1 and N2 and a pair of P-channel pull-up transistors P1 and P2. The N-channel transistors are coupled to ground from a grounding node Ng through a pair of N-channel transistors N3 and N4 having sense clocks S1 and S2 on their gates, and the P-channel transistors are coupled to Vdd from a node Nh through a P-channel transistor P3 having sense clock $\overline{S2}$, the complement of the sense clock S2, on its gate. Sense nodes 1 and 2 at the drains of the N-channel transistors are coupled to bit lines B1 and B2.

According to the invention, the N-channel transistors N1 and N2 are used for initial sensing, by activating S1, while the P-channel transistors P1 and P2 have no sensing function but merely pull up the 1-going bit line.

The bit lines B1 and B2 are each coupled to a large number of one-transistor memory cells, each memory cell having a storage capacitor Cs and an N-channel access transistor Ns. One cell is selected by an Xw voltage on a word line. There is a dummy cell on each line, including a dummy capacitor Cd and an access transistor Nd. A dummy row line on the side opposite the selected word line is activated by an Xdum voltage.

Figure 2:
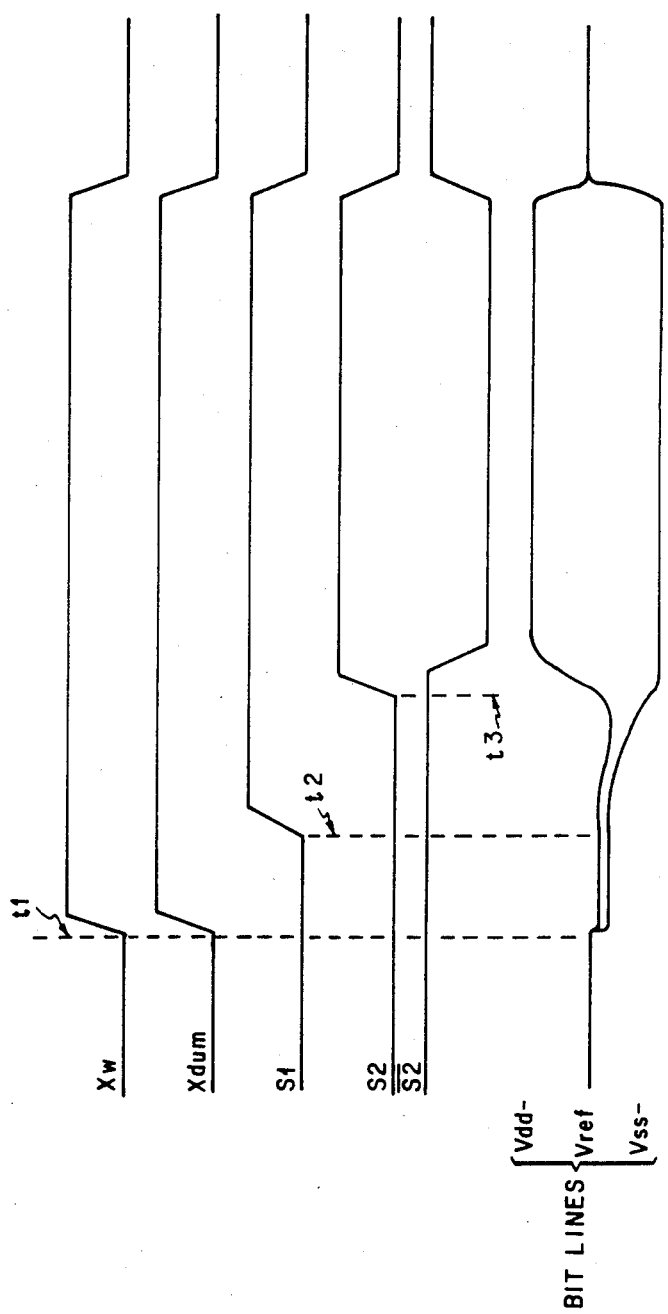
FIG. 2 is a timing diagram showing voltage vs. time for various nodes in the circuit of FIG. 1.

The sequence of operation of the elements of the sense amplifier of FIG. 1 is shown in the timing diagram of FIG. 2. In a precharge period prior to t1, the bit lines B1 and B2, as well as the nodes Ng and Nh, are precharged to one-half Vdd through transistors, not shown. The selected Xw and Xdum voltages go from zero to the Vdd level at time t1, turning on one of the cell transistors Ns and one dummy transistor Nd, on opposite sides of the sense amplifier. This causes the bit lines B1 and B2 to charge-share with the storage capacitor Cs on one side and the dummy capacitor Cd on the other. The precharge level and size of these capacitors are such that the resulting voltage on the bit line with Cs connected to it will be above or below the one on the dummy side, depending upon whether a 1 or a 0 is stored; the bit lines and sense nodes thus separate in voltage just after t1. This voltage differential is maintained for a time on the capacitance of the nodes 1 and 2 (including the bit lines and the gates of transistors N1, N2, P1, P2). At time t2 the sense clock S1 starts to ramp up toward Vdd turning on the transistor N3 and causing the cross-coupled flip-flop circuit to begin to operate; one of the nodes 1 and 2 decays toward zero and the other does not. The size of transistor N3 is chosen such that the ramp rate of node Ng from Vdd/2 toward zero is sufficiently slow as not to turn on (even under unbalance conditions) transistor N2 when reading a 0 or transistor N1 when reading a 1 stored in a capacitor Cs on the bit line B1 side.

It is important that the N-channel transistors N1 and N2 perform the initial sensing. This is advantageous since the N-channel transistors have a relatively higher conduction factor than P-channel transistors and thus can be smaller in size for a given amplification of the signal on the bit lines, providing a saving in area on the chip.

When S2 goes high at time t3, the zero-going bit line B1 or B2 discharges rapidly through N-channel transistor N1 or N2 and transistor N4 to ground, and after a gate delay $\overline{s2}$ drops so the one-going bit line is charged through P-channel transistor P1 or P2 and transistor P3 from the Vdd supply as soon as the zero-going node 1 or 2 is low enough to turn on the P-channel transistor. The $\overline{S2}$ clock may occur at the same time as S2 instead of slightly dleayed, but it is preferable that N4 turn on before P3 as this reduces current peaks.

With the process option that the N-channel transistors N1 and N2 and the P-channel transistors P1 and P2 have the same absolute value for threshold voltage, with the node Ng already being less than Vdd/2, the latching begins to accellerate with the transistors N1 and N2, and this is followed by restoring the one-going side by the P-channel transistors P1 and P2. With this approach the size of the transitor N4 can be selected for latching speed, and transistor P3 only sufficiently large for restoring the Vdd level of the one-going side to Vdd, thereby saving power. For example, for a given channel length, the gain of transistor N4 is greater than that of transistor P3. The gain of transistor P3 is greater than that of transistor N3.

The advantages of the circuit of the invention are several. The latching of the signal is faster because of the higher mobility in N-channel devices, and also the sense transistors may be smaller, saving area on the chip. As well, the P-channel pull-up transistors may be smaller since the N-channel devices have completed the latch function before turning on the P-channel devices. Smaller N-channel and P-channel transistors have the added advantage of lower current drain.

The bit lines B1 and B2 are coupled to the data I/O circuitry by column select transistors, not shown. For the selected column or columns, the bit lines are driven rail-to-rail at time t3, so the data bit can be coupled to the data I/O circuitry for output from the chip.

The current flow into and out of the chip on the Vdd and Vss lines, isolated to the contribution by the sense amplifiers, is critical in a high density DRAM. Prior to t2 there is no current in the sense amplifiers; beginning at t2, some current flows to Vss as the zero side begins to discharge, but the resistance of the transistor N1 is large. At t3 there is a larger current pulse as the zero side bit line is further discharged, then a Vdd pulse as the one-side is charged, but the total current is spread over a longer time, so the peak current is smaller. There would be, of course, other current peaks when $\overline{RAS}$ drops, when $\overline{CAS}$ drops, and when $\overline{RAS}$ goes high (precharge begins).

Figure 3:
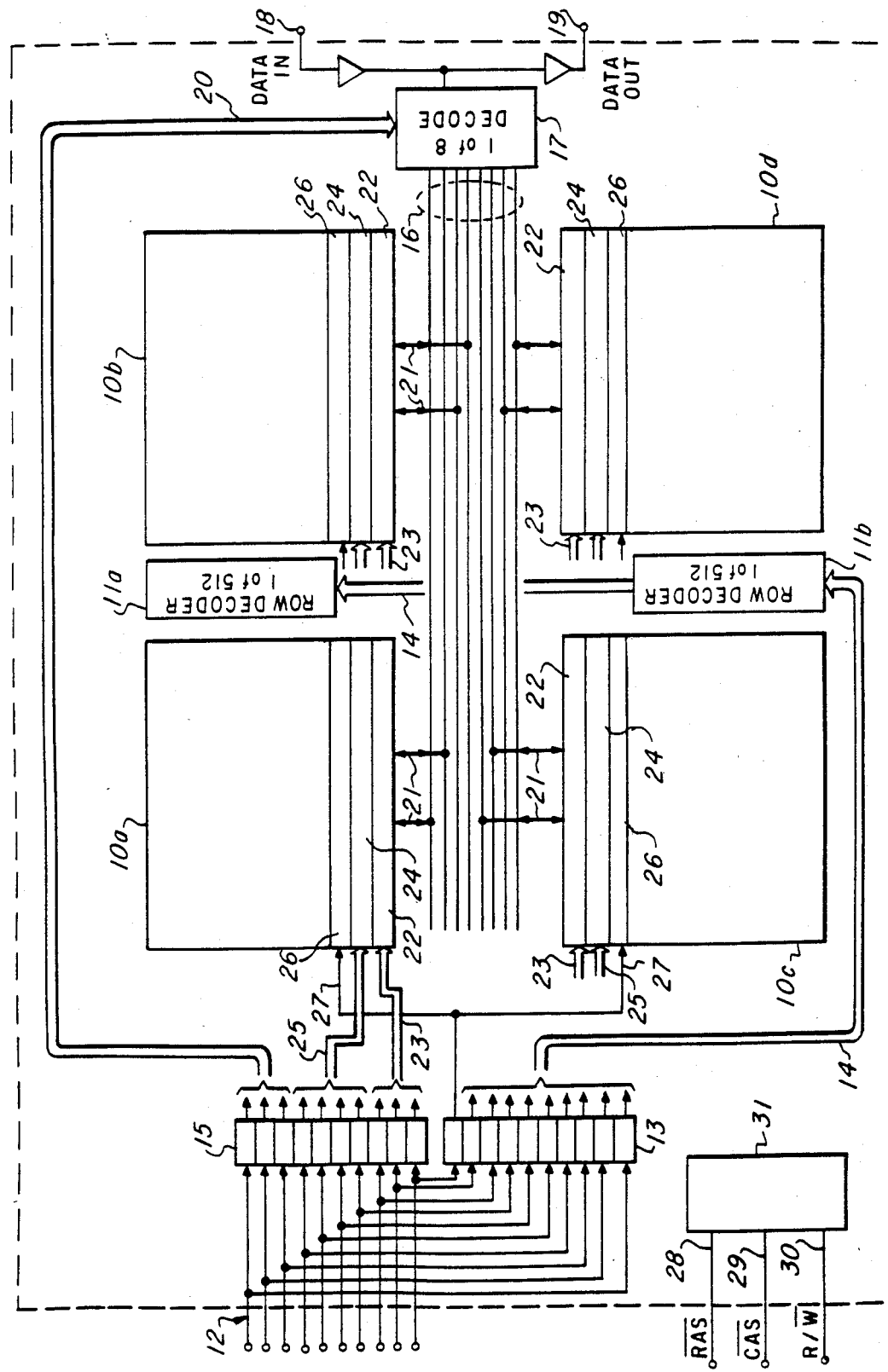
FIG. 3 is an electrical diagram in block form of a dynamic memory device of the 1-Megabit size which may use the sense amplifier circuit of the invention.

Referring to FIG. 3, a block diagram of one example of a semiconductor dynamic read/write memory chip is illustrated which may use the sense amplifier circuit constructed according to another embodiment of the invention. This device is of the so-called 1-Megabit size, having $2^{20}$ or 1,048,576 memory cells in an array of rows and columns. The array is partitioned into four identical blocks 10a, 10b, 10c and 10d, with each block containing 262,144 cells. Within each block, there are 512 row lines, and all row lines are connected to one of the row decoders 11a or 11b. Each row decoder 11a or 11b receives 9-bits of a 10-bit row address from adress input pins 12 by way of row address latches 13 and lines 14; the row decoders produce the row select voltage Xw as above. A 10-bit column address is also applied to the input pins 12, in time-multiplexed manner, and this column address is coupled to buffers 15. Eight data I/O lines 16 are positioned in the center of the array, and one of these eight is selected for data input or output by a 1-of-eight selector 17; a single I/O line from this selector 17 is connected through buffers to the data-in pin 18 and the data-out pin 19. The selector 17 receives three bits of the column address by lines 20 from the column address buffers 15. Two of the eight lines 16 are connected respectively to each of the blocks 10a, 10b, 10c and 10d by I/O lines 21. A 2-of-16 column selection is made in sixteen intermediate output buffers 22 for each block, using three bits of the column address on lines 23 from buffers 15. A 1-of-16 column selection is made in each of sixteen sets of sixteen intermediate output buffers 24 in each block 10a–10d, using four bits of the column address on lines 25 from buffers 15. Each one of 512 sense amplifiers 26 (like FIG. 1) in each block is connected to one of the columns in the array (each column is made up of two column line halves or "bit lines"). Each buffer 24 is coupled to one of two columns; this selection is based on one bit of the row address from buffers 13 on line 27.

Figure 3A:
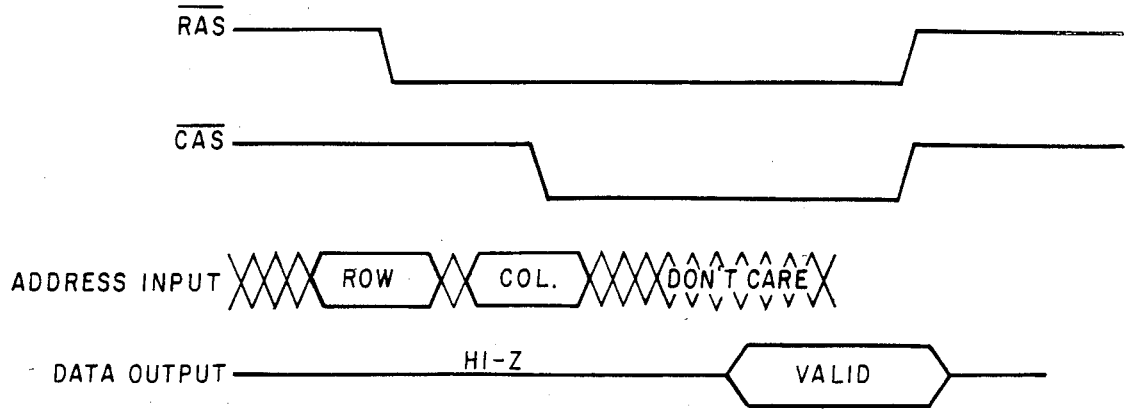
FIG. 3a is a timing diagram of the clock signals applied to the control circuit of FIG. 3.

The memory device receives a row address strobe $\overline{RAS}$ on input pin 28, and a column address strobe $\overline{CAS}$ on input pin 29. Selection of a read or a write operation is made by a R/$\overline{W}$ control on an input pin 30. A clock generator and control circuit 31 produces all of the internal clocks and controls as needed. For a single-bit read (or write), $\overline{RAS}$ and $\overline{CAS}$ drop to zero in sequence as illustrated in FIG. 3a, and a one-bit data read (or write) occurs.

Each block of the array contains two rows of dummy cells 32 in the usual manner, as discussed in the above-mentioned U.S. Pat. No. 4,239,993 or 4,081,701.

Figure 4:
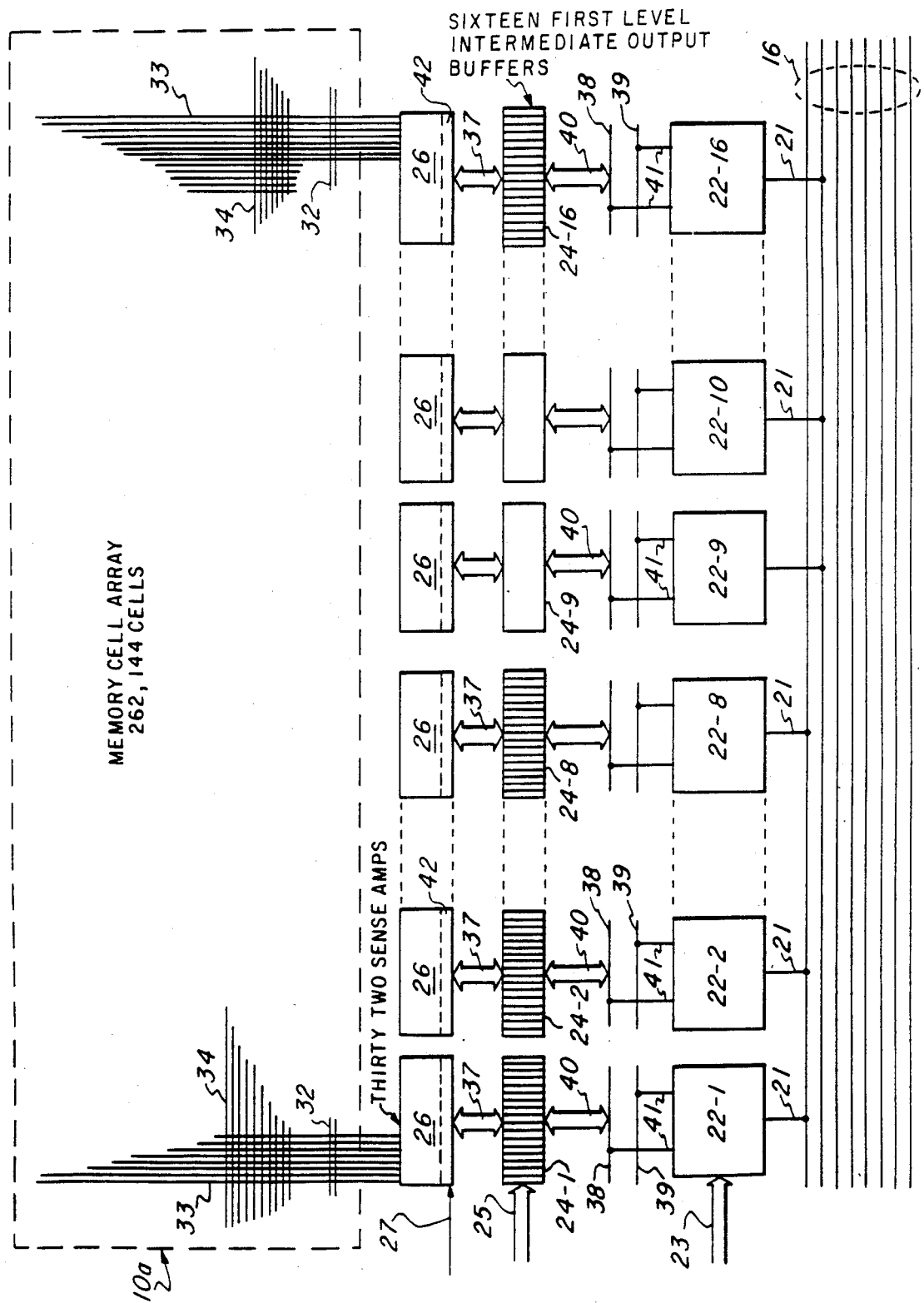
FIG. 4 is an electrical diagram in block form of a part of the memory device of FIG. 3.

Referring to FIG. 4, the I/O lines 16, the intermediate output buffers 22 and 24, and the sense amplifiers 26 are shown in more detail for a part of one of the blocks 10a–10d. In a given block, there are sixteen of the intermediate output buffers 22, in this figure labelled 22-1 . . . 22-16. Note that buffers 22-1 through 22-8 are in one group of eight associated with one of the lines 16 for this block, and the buffers 22-9 through 22-16 are in another group of eight connected with the other one of the lines 16 for this block by lines 21. For each one of the sixteen buffers 22-1 . . . 21-16, there is a set of sixteen buffers 24; here these sets are labelled 24-1 through 24-16 (sixteen in each set). For each set of sixteen buffers 24, a group of thirty-two sense amplifiers 26 is provided, and each sense amplifier 26 is connected to two of the bit lines 33 (one column equals two bit lines, corresponding to the bit lines B1 and B2 of FIG. 1). Intersecting the bit lines 33 are 512 row lines 34 in the memory cell array. The dummy row lines 32 also intercept the bit lines 33, as will be described. One of the two dummy lines is selected by the row decoder 11a, 11b using one bit of the nine-bit row address 14.

The tenth bit of the row address from buffers 13 is applied by the line 27 to a multiplex circuit for the sense amplifiers 26 to select which one of the two sense amplifiers of each pair is connected to the respective first level intermediate buffer 24 by lines 37. There are sixteen pairs of data/data-bar lines 38 and 39 in this block, each pair being coupled to the selected buffers 24 on one side by lines 40 and connected to the selected buffers 22 on the other side by lines 41. Note that the I/O changes from double-rail at the lines 38 and 39 to single rail at the data I/O lines 16, for a write operation.

Figure 5:
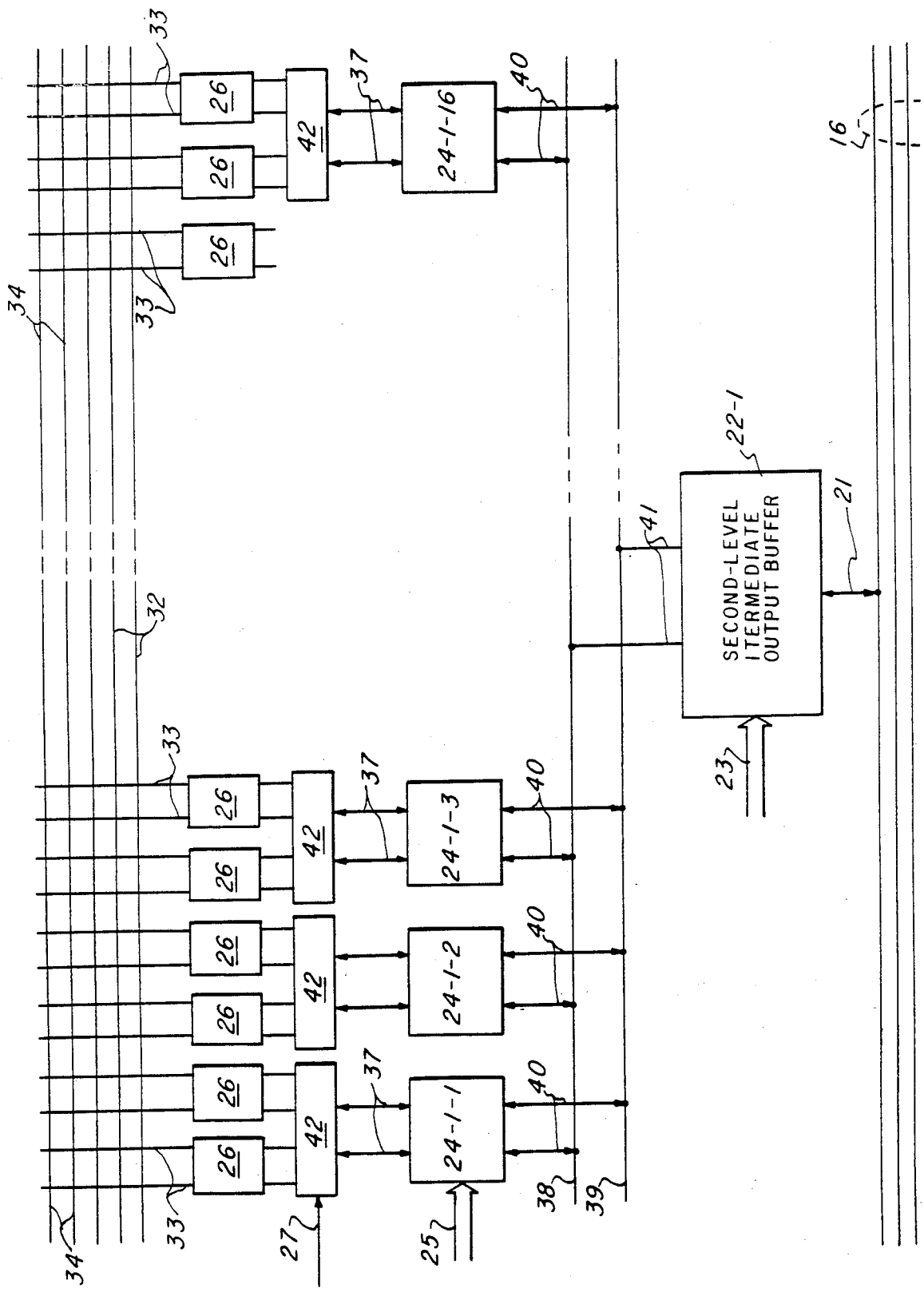
FIG. 5 is an electrical diagram in block form of a part of the circuitry of FIG. 4.

Referring to FIG. 5, a part of the circuitry of FIG. 4 is shown in more detail. The sense amplifiers 26 associated with the set of sixteen buffers 24-1 are shown. There are actually thirty-two sense amps 26 for this set. This set of sixteen buffers 24-1 is labelled 24-1-1 through 24-1-16 in this figure. Each individual sense amplifier 26 has two bit lines 33 extending from it, in the so-called folded bit line configuration. Thus, all word lines 34 and both dummy rows 32 are on the same side of the sense amp. The row lines 34 intersect the bit lines, and memory cells are at intersections of row or word lines and bit lines just as in FIG. 1, but folded. A multiplexer 42 for each pair of sense amplifiers 26 selects one, based on the address bit on line 27, for connection to the respective buffer 24-1-1, 24-1-2, etc., by lines 37. Only one of the sixteen buffers 24-1-1 through 24-1-16 is selected at any one time, based on the four column address bits on lines 25, so only one will be operating to couple a read- or-write bit of data to or from the lines 38, 39 by lines 40. The buffer 22-1 of FIG. 5 may or may not be selected by the 2-of-16 select provided by three bits on lines 23, for coupling the dual-rail I/O lines 38, 39 to the single rail I/O line 16 for this group.

Figure 6:
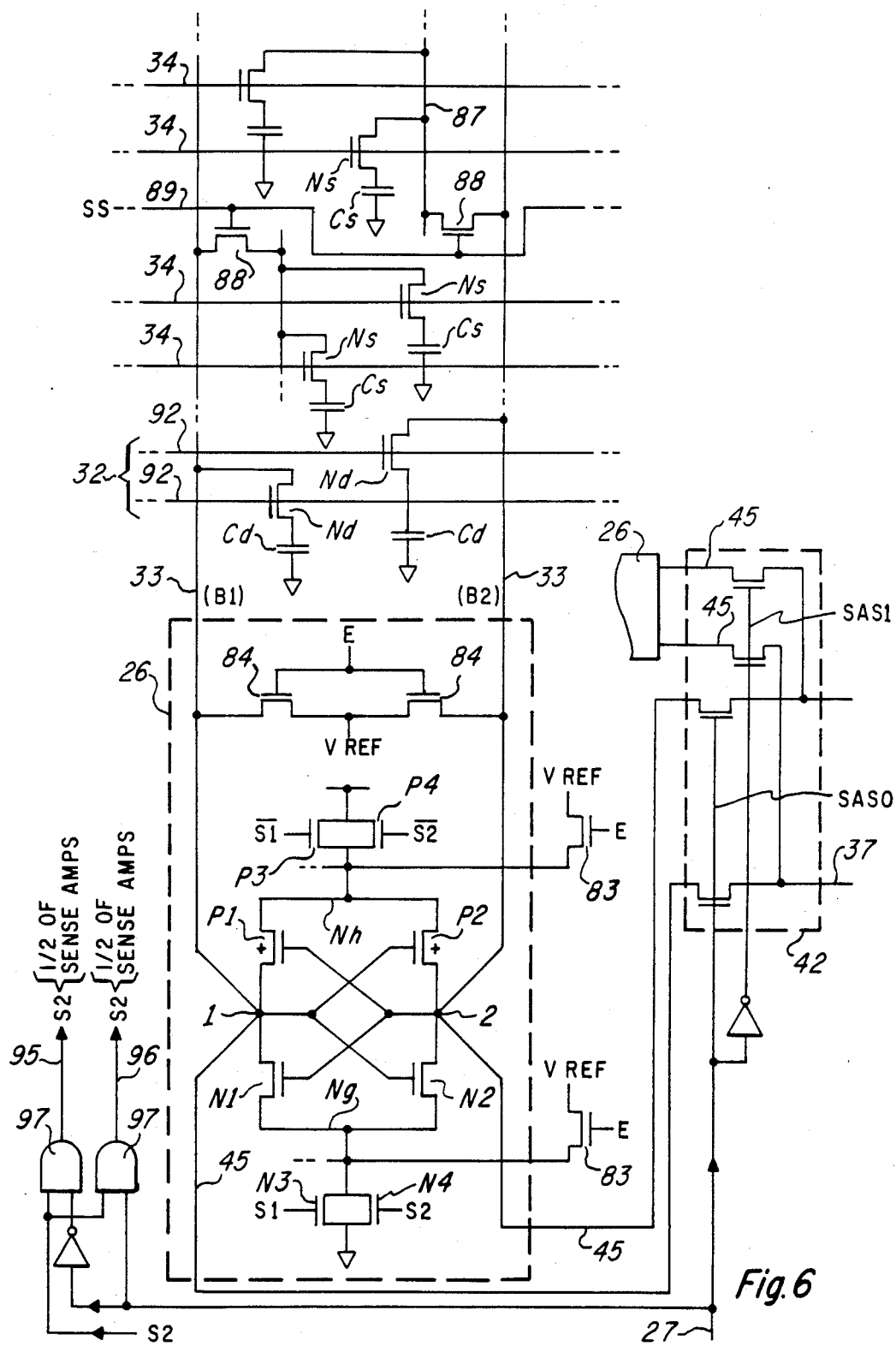
FIG. 6 is an electrical diagram in schematic form of the sense amplifier and cell array of FIGS. 3-5.

Referring to FIG. 6, one of the sense amplifiers 26 constructed for N-channel sensing according to the invention is shown in detail. This figure also shows the two bit lines 33 for this sense amplifier and four of the 512 row lines 34 perpendicular to these bit lines. The sense amplifier employs a CMOS cross-coupled flip-flop like FIG. 1 having N-channel driver transistors N1 and N2 and P-channel pull-up transistors P1 and P2. Sense nodes 1 and 2 are connected to bit lines 33 through the source-drain paths of isolating transistors T1 and T2. The node Ng on the ground side of this flip-flop is coupled to ground through two N-channel transistors N3 and N4, which have sense clocks S1 and S2 on their gates. The transistor N3 with S1 on its gate is much smaller than the other transistor N4, and clock S1 occurs first, so the initial N-channel sensing is at a lower-gain condition, and is performed by N-channel transistors N1 and N2. On the Vdd side, the node Nh is coupled to the supply through a P-channel transistor P3, which has sense clock $\overline{S2}$ on its gate. The sense clock $\overline{S2}$ is the complement of S2, so the P-channel transistor P3 starts to operate only after the clock S2 is activated. The sizing of the transistors is as discussed above. There is a two-interval sense operation, first S1 (at a relatively low current level), then S2 and $\overline{S2}$. The transistors N3 and N4, as well as transistor P3, are shared with all of the other sense amplifiers 26 in two blocks 10a and 10b, i.e., 1024 sense amplifiers. The nodes Ng and Nh are precharged to about one-half Vdd by transistors 83 when E is high.

The bit lines 33 are precharged and equalized through three transistors 84 which have an equalize clock voltage E on their gates; two of these transistors 84 have their sources connected to a reference voltage Vref. The value of this reference voltage is about half Vdd, so little or no net charge is needed from the chip supply Vdd to precharge all of the bit lines. That is, one line 33 will be high and the other low for each sense amplifier, so one will charge the other, and Vref need only supply any differential that might have occurred. The clock E is generated in the control circuitry 31 after the end of an active cycle, when $\overline{RAS}$ goes high.

Each of the memory cells of FIG. 6 consists of a capacitor Cs and an access transistor Ns, just as in FIG. 1, with the gates of all of the 512 access transistors Ns in a row being connected to a row line 34. Only one row line 34 of 512 in the block is turned on at any one time, so only one memory cell capacitor Cs is connected to a bit line 33 for a given sense amplifier 26. According to the invention of application Ser. No. 634,898, filed July 26, 1984 by David J. McElroy, assigned to Texas Instruments, in order to reduce the ratio of the bit line capacitance to the value of the storage capacitance Cs, a number of bit line segments 87 are employed for each pair of bit lines 33. One of these segments 87 is coupled to a bit line 33 at a given time by one of the transistors 88. For example, each segment 87 may have thirty-two cells connected to it, so in the embodiment disclosed herein there must be sixteen of these segments 87 for each sense amplifier ($16 \times 32 = 512$). Half of the segments are connected to one bit line and half to the other. The row decoder 11a or 11b selects the appropriate one of sixteen lines 89 by a segment select voltage SS, at the same time as this decoder selects 1-of-512 row lines 34, based on certain ones of the same nine address bits from lines 14.

In the dummy rows 32, a pair of dummy cells are provided for each pair of bit lines 33, and these dummy cells consist of dummy capacitors Cd and access transistors Nd as before. When the selected storage cell is on the left-hand bit line 33, then the right-hand dummy cell is selected in the row decoders 11a, 11b by one of the decoder output lines 92, and vice versa, in the usual manner. One bit of the row address is used in the row decoder to select one or the other of these lines 92 of the dummy cell rows 32.

Figure 7:
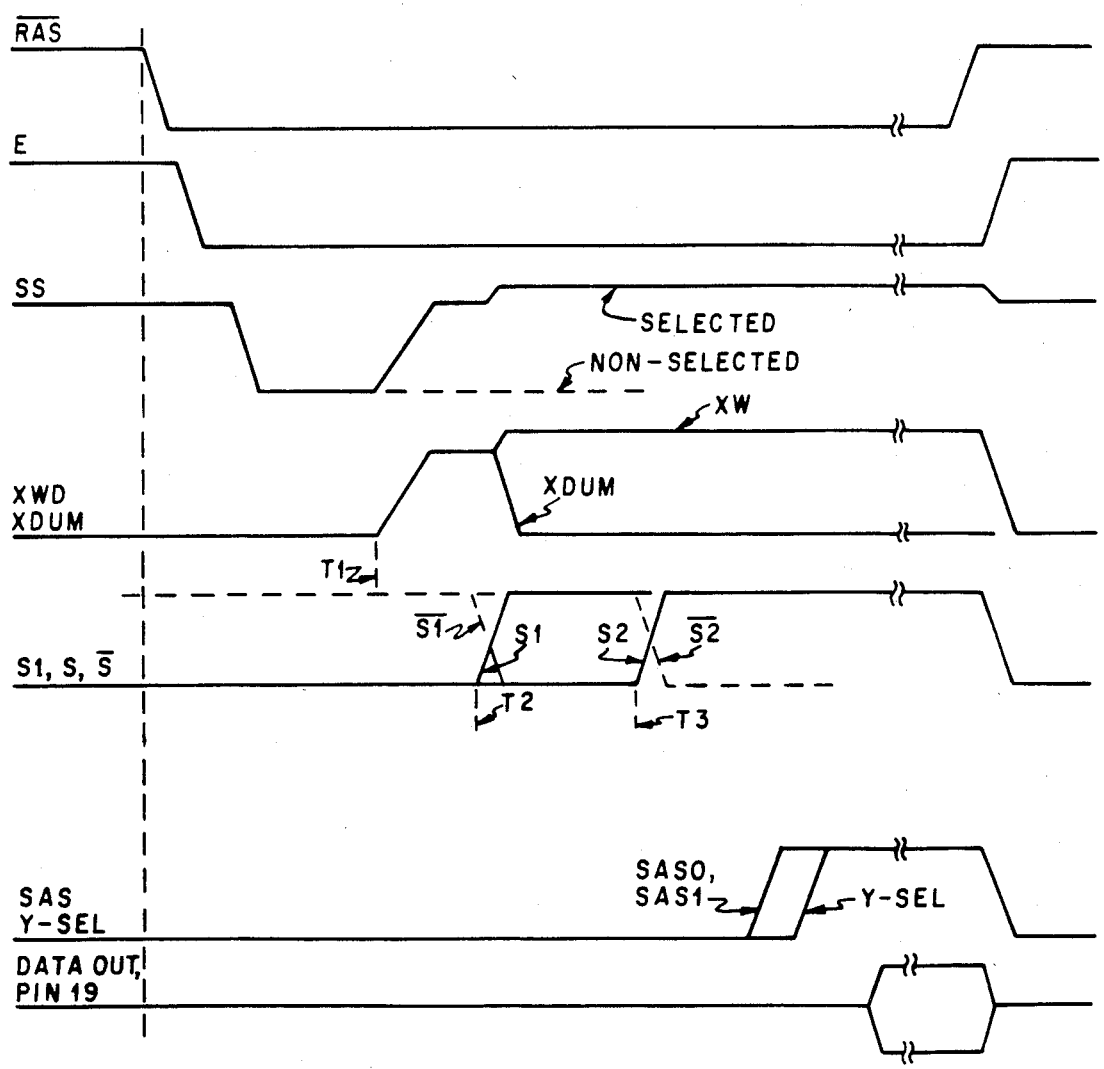
FIG. 7 is a timing diagram showing voltage vs. time for various nodes in the circuit of FIGS. 3-6.

Referring to FIG. 7, the sequence of operation of the memory device will be explained for a single-bit read operation. An active cycle begins with the $\overline{RAS}$ voltage dropping from +5 to zero. This example is a read cycle, so at this time the R/$\overline{W}$ input voltage is at +5 v. The time prior to this is a precharge cycle, during which the equalize voltage E has been high, so all of the bit lines 33 and the nodes Ng and Nh, have been precharged to the Vref voltage, assumed to be about ½ Vdd or +2.5 v. The segment select signal SS on all of the lines 89 is high, so all of the segments 87 are also precharged to the Vref voltage. The dropping of $\overline{RAS}$ causes the equalize voltage E to drop, isolating the pairs of bit lines 33 from each other and from Vref. The segment select signal SS then drops, isolating all of the segments 87 from the bit lines 33. As soon as the row decoders 11a, 11b have had time to respond to the row address, at time t1 the Xw and Xdum voltages start to rise on the selected 1-of-512 row line 34 and selected 1-of-2 dummy line 92; at the same time t1, the segment-select signal SS on one of the lines 89 is brought up. These address voltages Xw, Xdum and SS are brought up rather slowly, and later, some time after reaching the Vdd level, SS and Xw are boosted above Vdd to eliminate the Vt drop across the access transistors Ns and 88. The Xdum voltage falls, since the function of the dummy cells is completed during initial sensing, and the dummy capacitors can be decoupled from the bit lines so these capacitors can be precharged, as disclosed in copending application Ser. No. 630,507, filed July 11, 1984 by Tran, McAdams and Childers, assigned to Texas Instruments. At time t2, the sense amplifiers 26 are first activated (at low level) by the S1 voltage going high, turning on the N-channel transistor N3; this begins to separate the bit lines 33 further than the separation caused by the differential voltages on the storage cell and dummy cell. However, before a large current flows to the supply Vss through transistors N1 or N2, the T voltage falls, isolating the bit lines 33 from the sense nodes 1 and 2. After the T voltage falls, the sense voltage S2 is brought up at t3, so the large transistor N4 begins to conduct; also S2 drops, so the P-channel pull-up transistor P3 begins to conduct. After S2 rises and S2 drops, the T voltage is brought up to Vdd at time t4. After the isolating transistors T1 and T2 have been turned back on, the bit lines are forced to a rail-to-rail condition; one bit line 33 is high and the other at zero. The sense-amp-select voltage SAS1 or SAS2 (selected by address bit 27) is turned on, connecting one of the sense amplifiers to a buffer 24 via lines 37 of FIG. 5, using the multiplexer 42. Just after this the Y-select outputs from column decoders are valid, so the selected data bit become valid on the line 16, and shortly thereafter the data bit is valid on the output pin 19.

When this invention has been described with reference to illustrative embodiments, this description is not intended to be construed in a limiting sense. Various modifications of the illustrative embodiments, as well as other embodiments of the invention, will be apparent to persons skilled in the upon reference to this description. It is therefore contemplated that the appended claims will cover any such modifications or embodiments as fall within the true scope of the invention.

What is claimed:

1. A sense amplifier circuit for a memory device, comprising:
   a pair of bit lines, and a plurality of memory cells connected to each of said bit lines,
   a cross-coupled latch circuit including a first pair of N-channel transistors and a second pair of P-channel transistors, each transistor having a source-to-drain path and a gate, the source-to-drain paths of the first pair of N-channel transistors connected between a pair of sense nodes and grounding means, the source-to-drain paths of the second pair of P-channel transistors connected between said sense nodes and a voltage supply node,
   said grounding means including a third pair of N-channel transistors, each said transistor of the third pair having a source-to-drain path and a gate, said voltage supply node being connected to a positive voltage supply by a source-to-drain path of a second P-channel transistor,
   coupling means separately connecting said pair of sense nodes to said pair of bit lines,
   and control means activating said gate of one of third pair of transistors at a first time in an active cycle when said memory cells are activated for coupling to said bit lines, and then activating said gate of the other of said third pair at a second time when said grounding means is activated, while maintaining said voltage supply node at zero voltage, then activating after said first time in said operating cycle the gate of said second P-channel transistor.

2. A circuit according to claim 1 wherein one of said third pair of N-channel transistors is much smaller than said other of said third pair.

3. A circuit according to claim 2 wherein said coupling means includes a pair of N-channel coupling transistors.

4. A circuit according to claim 3 wherein said grounding means including said third pair of N-channel transistors is connected between a grounding node and a Vss terminal of a voltage supply.

5. A circuit according to claim 4 wherein said control means activates the gates of said third pair of N-channel transistors and said second P-channel transistor.

6. A circuit according to claim 5 wherein said memory cells are one-transistor dynamic MOS read/write memory cells.

7. A CMOS sense amplifier circuit for a semiconductor memory array, the array having row lines for selecting cells based on an address, and having bit lines perpendicular to the row lines and connected to the cells, comprising:
   a CMOS bistable latch circuit having differential inputs, and having first and second power supply nodes, each of the differential inputs being coupled to one of said bit lines for sensing the voltage thereon;
   the bistable latch circuit including a pair of matched cross-coupled N-channel driver transistors with each driver transistor having a source-drain path connected between said first power supply node and one of the differential inputs, and the bistable latch circuit having a pair of cross-coupled P-channel transistors with each said P-channel transistors having a source-drain path connected between said second power supply node and one of the differential inputs;
   first and second N-channel transistors having gates, and having source-to-drain paths connected in parallel between said first power supply node and a reference terminal of a power supply, said first transistor being of high resistance and having its gate connected to a first clock voltage, said second transistor being of low resistance and having its gate connected to a second clock voltage,
   a third P-channel transistor having a gate and having a source-to-drain path connected between said second power supply node and a positive terminal of said power supply, said third transistor being of high resistance and having its gate connected to a complement of said second clock voltage, clock means applying said first clock voltage to the gate of said first transistor at a given time in an operating cycle, and thereafter applying said second clock voltage to the gate of said second transistor and applying said complement of said second clock voltage to said third transistor later in such operating cycle;

said second power supply node being maintained at substantially the voltage of said reference terminal in said operating cycle until said later time.

8. A circuit according to claim 7 wherein said pair of cross-coupled P-channel transistors have source-to-drain paths separately connecting said differential inputs to said second power supply node.

9. A circuit according to claim 8 wherein applying only said first and third clock voltages produces a slow sensing operation; and applying said first, second and third clock voltages produces a fast sensing operation.

10. A circuit according to claim 8 wherein said cells are one-transistor dynamic memory cells.

11. A semiconductor memory device containing an array of rows and columns of memory cells including row lines for selecting cells based on an address, and including bit lines perpendicular to the row lines and connected to the cells; said device comprising:

(a) a plurality of sense amplifiers, each sense amplifier including a bistable CMOS latch circuit having a pair of sense nodes providing differential inputs, and having a positive supply node and a grounding node, each of the differential inputs being coupled to one of said bit lines for sensing the voltage thereon; said bistable latch circuit including a pair of N-channel transistors having source-to-drain paths separately connecting said sense nodes to said grounding node, and including a pair of P-channel transistors having source-to-drain paths separately connecting said sense nodes to said supply node;

(b) first and second N-channel transistors having gates, and having source-to-drain paths separately connected in parallel between said grounding node and a ground terminal of a power supply, said first N-channel transistor being of high resistance and having its gate connected to a first clock voltage, said second N-channel transistor being of low resistance and having its gate connected to a second clock voltage, (c) a third P-channel transistor having a gate and having a source-to-drain path connected between said positive supply node and the positive voltage terminal of said power supply, said third transistor being of high resistance and having its gate connected to a third clock voltage, said positive supply node being maintained at about the voltage of said ground terminal until said gate of the third P-channel transistor is activated;

(d) clock means applying said first clock voltage to the gate of said first transistor at a given time in an operating cycle, and thereafter applying said second clock and said third clock voltages to the gates of said second and third transistors later in such operating cycle.

12. A device according to claim 11 wherein said third clock voltage is the complement of said second clock voltage.

13. A device according to claim 11 wherein said memory cells are one-transistor dynamic memory cells.

14. A device according to claim 13 including a pair of coupling transistors separately connecting said sense nodes to said bit lines.

15. A device according to claim 11 wherein the gain of said third P-channel transistor is less than that of said second N-channel transistor.

* * * * *